(12) United States Patent
Gazounaud et al.

(10) Patent No.: US 8,156,396 B1
(45) Date of Patent: *Apr. 10, 2012

(54) METHOD AND SYSTEM FOR CORRECTING TIMING ERRORS IN HIGH DATA RATE AUTOMATED TEST EQUIPMENT

(76) Inventors: Jean-Yann Gazounaud, St Just St Rambert (FR); Howard Maassen, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/898,621

(22) Filed: Oct. 5, 2010

Related U.S. Application Data

(63) Continuation of application No. 11/982,075, filed on Oct. 31, 2007, now Pat. No. 7,810,005.

(60) Provisional application No. 60/856,176, filed on Nov. 1, 2006.

(51) Int. Cl.
*G01R 31/28* (2006.01)

(52) U.S. Cl. .......... 714/744; 714/25; 714/742; 714/724; 714/32; 714/731; 714/726; 714/709; 714/700; 324/158.1; 324/73.1; 700/11; 702/117; 702/123; 702/124; 702/125

(58) Field of Classification Search .......... None
See application file for complete search history.

(56) References Cited

U.S. PATENT DOCUMENTS

| | | | |
|---|---|---|---|
| 5,461,310 A * | 10/1995 | Cheung et al. | 324/756.05 |
| 5,477,139 A * | 12/1995 | West et al. | 324/750.01 |
| 5,479,415 A * | 12/1995 | Staiger | 714/743 |
| 5,590,137 A | 12/1996 | Yamashita | |
| 5,931,962 A * | 8/1999 | Dang | 714/731 |
| 6,049,900 A * | 4/2000 | Fournel et al. | 714/724 |
| 6,496,953 B1 * | 12/2002 | Helland | 714/744 |
| 7,069,458 B1 * | 6/2006 | Sardi et al. | 713/401 |
| 7,222,273 B2 * | 5/2007 | Cho | 714/720 |
| 7,233,599 B2 * | 6/2007 | Deas et al. | 370/420 |
| 2002/0147576 A1 | 10/2002 | Hsu et al. | |
| 2004/0059437 A1 | 3/2004 | Cullen et al. | |
| 2005/0050409 A1 | 3/2005 | Cho | |
| 2007/0174805 A1 | 7/2007 | Hsu et al. | |

\* cited by examiner

*Primary Examiner* — John Trimmings

(57) ABSTRACT

A system and method for reducing timing errors in automated test equipment (ATE) offering increased data rates for the testing of higher-speed integrated circuits. Embodiments provide an effective mechanism for increasing the data rate of an ATE system by delegating processing tasks to multiple test components, where the resulting data rate of the system may approach the sum of the data rates of the individual components. Each component is able to perform data-dependent timing error correction on data processed by the component, where the timing error may result from data processed by another component in the system. Embodiments enable timing error correction by making the component performing the correction aware of the data (e.g., processed by another component) causing the error. The data may be shared between components using existing timing interfaces, thereby saving the cost associated with the design, verification and manufacturing of new and/or additional hardware.

27 Claims, 10 Drawing Sheets

|  | F0 Timing | F1 Timing | F2 Timing | ... | F31 Timing |
|---|---|---|---|---|---|
| Timing Set 1 | 1.1 ns | 1.4125 ns | 1.725 ns | | 10.7875 ns |
| Timing Set 2 | 1.5 ns | 1.8125 ns | 2.125 ns | | 11.1875 ns |
| Timing Set 3 | 2 ns | 2.3125 ns | 2.625 ns | | 11.6875 ns |
| ... | | | | | |
| Timing Set n | 3 ns | 3.3125 ns | 3.625 ns | | 12.6875 ns |

| $F_{n-3}$ | $F_{n-2}$ | $F_{n-1}$ | $F_n$ | Timing Correction Value (ps) |
|---|---|---|---|---|
| 0 | 0 | 0 | 0 | 0 |
| 0 | 0 | 0 | 1 | -30 |
| 0 | 0 | 1 | 0 | 15 |
| 0 | 0 | 1 | 1 | 0 |
| 0 | 1 | 0 | 0 | 0 |
| 0 | 1 | 0 | 1 | 0 |
| 0 | 1 | 1 | 0 | -10 |
| 0 | 1 | 1 | 1 | 0 |
| 1 | 0 | 0 | 0 | 0 |
| 1 | 0 | 0 | 1 | -10 |
| 1 | 0 | 1 | 0 | 0 |
| 1 | 0 | 1 | 1 | 0 |
| 1 | 1 | 0 | 0 | 0 |
| 1 | 1 | 0 | 1 | 15 |
| 1 | 1 | 1 | 0 | -30 |
| 1 | 1 | 1 | 1 | 0 |

FIGURE 7

METHOD AND SYSTEM FOR CORRECTING TIMING ERRORS IN HIGH DATA RATE AUTOMATED TEST EQUIPMENT

RELATED APPLICATIONS

The present application is a continuation of U.S. patent application Ser. No. 11/982,075, filed Oct. 31, 2007, entitled "METHOD AND SYSTEM FOR CORRECTING TIMING ERRORS IN HIGH DATA RATE AUTOMATED TEST EQUIPMENT," naming Jean-Yann Gazounaud and Howard Maassen as inventors, assigned to the assignee of the present invention, which claims the benefit of U.S. Provisional Patent Application No. 60/856,176, filed Nov. 1, 2006, entitled "METHOD AND SYSTEM FOR CORRECTING TIMING ERRORS IN HIGH DATA RATE AUTOMATED TEST EQUIPMENT," naming Jean-Yann Gazounaud and Howard Maassen as inventors, assigned to the assignee of the present invention. These applications are incorporated herein by reference in their entirety and for all purposes.

BACKGROUND OF THE INVENTION

As the speed and complexity of integrated circuits increase, the data rates used by automated test equipment (ATE) for testing such integrated circuits is also increasing. For example, while data rates near a single Gbps were once sufficient for the testing of most any integrated circuit, modern integrated circuits require much higher data rates approaching 10 Gbps. And in the future, data rates required to test new integrated circuits will continue to increase as technology improves.

In addition to higher data rates, the testing of modern integrated circuits also requires higher precision with reduced timing error. As discussed in U.S. Pat. No. 6,496,953 to Helland, which is hereby incorporated by reference in its entirety, timing error in an ATE test signal varies based upon the pulse width of the signal preceding a given event (e.g., a transition from one state to another of the test signal). As such, timing error due to pulse width should be accounted for to increase edge placement accuracy and enable the testing of higher speed integrated circuits.

Although the '953 patent proposes a solution for correcting pulse width timing error, the data rate for testing integrated circuits of the system taught in the '953 patent is limited. As such, as higher-speed integrated circuits emerge, the system taught in the '953 patent will be able to test fewer and fewer devices.

SUMMARY OF THE INVENTION

Accordingly, a need exists for automated test equipment (ATE) capable of testing high speed integrated circuits. Additionally, a need exists for testing such high speed integrated circuits with reduced timing error. Further, a need exists to reduce pulse width timing error in an ATE instrument capable of testing high speed integrated circuits. Embodiments of the present invention provide novel solutions to these needs and others as described below.

Embodiments of the present invention are directed towards a system and method for reducing timing errors in automated test equipment (ATE) offering increased data rates for the testing of higher-speed integrated circuits. More specifically, embodiments provide an effective mechanism for increasing the data rate of an ATE system by delegating processing tasks to multiple test components, where the resulting data rate of the system may approach the sum of the data rates of the individual components. Each component is able to perform data-dependent timing error correction on data processed by the component, where the timing error may result from data processed by the component itself or another component in the system. In the case where the timing error results from data processed by another component, embodiments enable timing error correction by making the component performing the correction aware of the data (e.g., processed by another component) causing the error (e.g., a pulse width timing error). The data may be shared between components using existing timing interfaces, thereby saving the cost associated with the design, verification and manufacturing of new and/or additional hardware.

In one embodiment, an automated test equipment system includes a first test component for generating a first test signal for testing an integrated circuit, the first test signal generated in response to receiving a first portion of functional data for testing the integrated circuit, wherein the first test component is operable to correct timing errors in the first test signal using data from the first portion. The system also includes a second test component for generating a second test signal for testing the integrated circuit, the second test signal generated in response to receiving a second portion of the functional data for testing the integrated circuit, wherein the second test component is operable to correct timing errors in the second test signal using data from the second portion. An interface is coupled to the second test component and for enabling the second test component to access a select sub-portion of the first portion of the functional data. The second test component is further operable to correct timing errors in the second test signal using the select sub-portion fed to the second test component via the interface, where the select sub-portion is processed before the second portion of the functional data.

In another embodiment, a method for correcting timing errors in automated test equipment includes accessing functional data for testing an integrated circuit, the functional data comprising a first data portion and a second data portion, the first data portion for processing on a first test component and the second data portion for processing on a second test component. A timing value is determined for the second data portion, the timing value indicating when an event associated with the second data portion shall occur. A timing correction value is also determined for the second data portion based upon a portion of a pulse width associated with the first data portion. The timing value is then adjusted by the timing correction value to generate an updated timing value for the event.

And in yet another embodiment, a method for increasing data rates of automated test equipment with data-dependent timing correction capabilities includes accessing functional data for testing an integrated circuit, the functional data comprising a first data portion and a second data portion, the first data portion adjoining and processed before the second data portion. The first data portion is allocated to a first test component for generating a first test signal, wherein the first data portion comprises a portion of a pulse width. The second data portion is allocated to a second test component for generating a second test signal, wherein the second data portion has a timing value indicating when an event associated with the second data portion shall occur. An updated timing value is generated for the event by applying a timing correction value to the timing value, the timing correction value based upon the portion of a pulse width of the first data portion. The first test signal is generated. The second test signal is generated in accordance with the updated timing value. The first and second test signals are then provided to the integrated circuit for testing thereof.

BRIEF DESCRIPTION OF THE DRAWINGS

The present invention is illustrated by way of example, and not by way of limitation, in the figures of the accompanying drawings and in which like reference numerals refer to similar elements.

FIG. 5 shows an exemplary timing value data table stored in memory in accordance with one embodiment of the present invention.

FIG. 7 shows an exemplary timing correction value data table stored in memory in accordance with one embodiment of the present invention.

DETAILED DESCRIPTION OF THE INVENTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

EMBODIMENTS OF THE INVENTION

Figure 1:
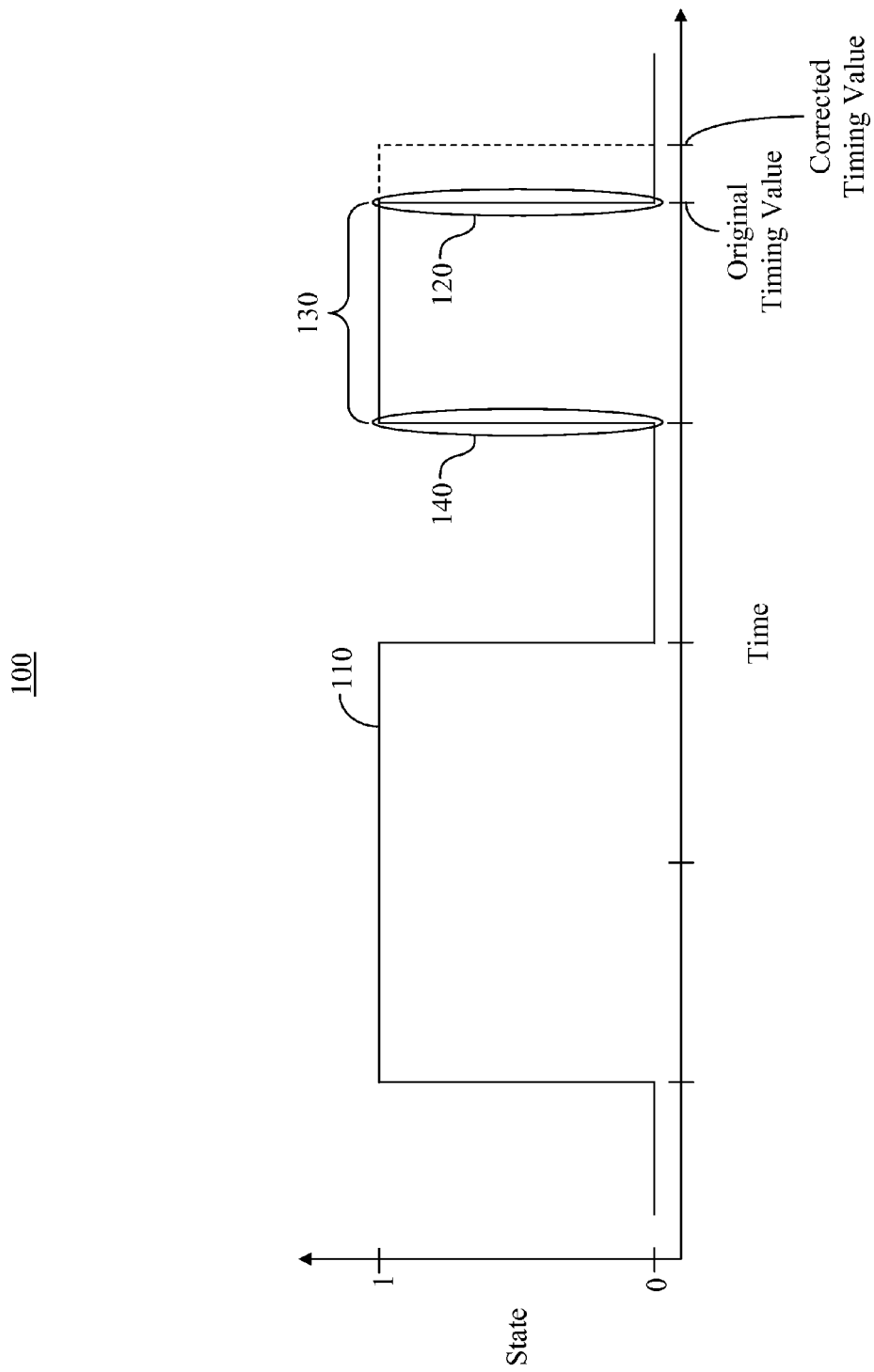
FIG. 1 shows an exemplary timing diagram of state and timing characteristics of a test event in accordance with one embodiment of the present invention.

FIG. 1 shows exemplary timing diagram 100 of state and timing characteristics of a test event in accordance with one embodiment of the present invention. As shown in FIG. 1, test signal 110 (e.g., generated from functional test data) undergoes several events (e.g., a transition from state 0 to state 1, or from state 1 to state 0). For example, event 120 involves a change from state 1 to state 0 at a given timing value (e.g., labeled "original timing value"). As such, each test event (e.g., 120) has a respective state (e.g., state 0) and a respective timing value (e.g., "original timing value").

Test signal 110 may be fed from automated test equipment (ATE) to an integrated circuit (e.g., a device under test or DUT) for testing thereof. As such, the DUT may receive the test signal (e.g., 110) comprising an event sequence, where a response from the DUT may be processed by the ATE (e.g., to determine whether the DUT passes or fails the test).

One of the most significant sources of error in ATE test signals (e.g., 110) is pulse width timing error. Pulse width timing error is caused by a pulse in functional data preceding an edge (e.g., a test signal transition comprising an event), where the duration of the pulse may affect edge placement accuracy. For example, pulse width 130, which begins at event 140 and ends at event 120, may cause incorrect edge placement of event 120. As such, embodiments enable a corrected timing value (e.g., as indicated by the dashed lines) to be determined (e.g., based upon functional data preceding an event) and applied to event 120 to reduce associated timing error (e.g., represented in FIG. 1 by the distance between the original and corrected timing values for event 120). Additionally, embodiments enable timing error correction in systems utilizing multiple test components processing respective portions of a functional data stream, where data contributing to a timing error affecting an event can be processed on a different system from that processing the functional data comprising the event itself.

Figure 2:
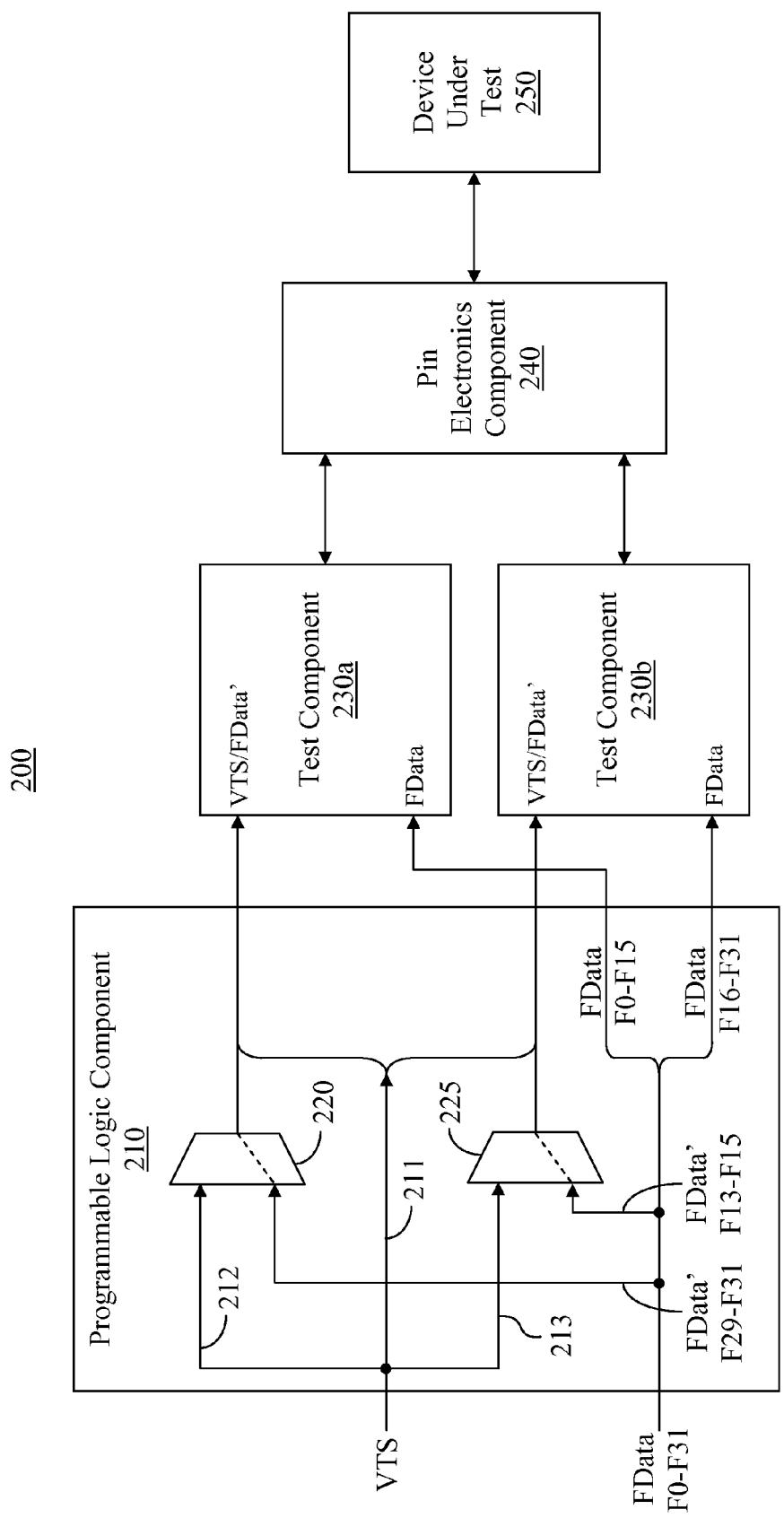
FIG. 2 shows an exemplary system with multiple test components for testing integrated circuits in accordance with one embodiment of the present invention.

FIG. 2 shows exemplary system 200 with multiple test components for testing integrated circuits in accordance with one embodiment of the present invention. As shown in FIG. 2, programmable logic component 210 (e.g., implemented by an FPGA or the like) receives both functional data (FData) and timing information conveyed over the vector type select (VTS) input. The FData (e.g., comprising at least one test pattern for testing a coupled DUT) is fed to component 210 using a 32-bit stream of functional data (e.g., conveyed over a 32-bit wide interface, using a 32-bit word length, etc.), which may indicate multiple events to be performed in accordance with timing information fed to component 210 (e.g., via the VTS input). The FData is then split into multiple portions (e.g., F0-F15, F16-F31, etc.) to feed respective test components 230a and 230b. In one embodiment, test components 230a and 230b may be implemented in accordance with the '953 patent to Helland.

In response to receipt of FData and/or VTS signals, test components (e.g., 230a and 230b) may generate test signals (e.g., 110) for testing DUT 250. As shown in FIG. 2, the test signals are fed to and/or from DUT 250 via pin electronics component 240 (e.g., comprising drivers, comparators, etc. necessary to communicate signals between DUT 250 and test components of system 200).

Since the test signals generated by each test component may represent adjoining portions of FData, sending the respective test signals to a DUT may effectively replicate a more powerful test component sending a single test signal representing the FData data stream input to component 210. As such, data processing tasks are divided among multiple test components (e.g., 230a, 230b, etc.) to effectively increase the data rate of system 200 (e.g., to a data rate approaching the sum of the individual data rates of components 230a and 230b).

In addition to offering higher data rates for testing DUTs (e.g., 250), system 200 can provide timing correction for test signals generated by the multiple test components (e.g., 230a, 230b, etc.). Component 210 comprises multiplexers 220 and 225 (e.g., implemented in hardware, software, etc.) to enable test components of system 200 to receive portions of data (e.g., labeled FData') allocated to other test components of system 200, thereby enabling the test components to correct timing errors resulting from functional data (e.g. comprising at least a portion of a pulse width preceding an event) processed by other test components. For example, multiplexer 220 conveys FData' bits F29-F31 (e.g., processed by test component 230b) to test component 230a such that test component 230a can correct timing errors resulting from data processed by test component 230b (e.g., where bits F29, F30 and/or F31 may comprise a portion of a pulse width causing timing error for an event processed by test component 230b). Similarly, multiplexer 225 conveys FData' bits F13-F15 (e.g., processed by test component 230a) to test component 230b such that test component 230b can correct timing errors resulting from data processed by test component 230a (e.g., where bits F13, F14 and/or F15 may comprise a portion of a pulse width causing timing error for an event processed by test component 230a).

As shown in FIG. 2, component 210 sends the portions of FData' used for correcting timing errors over unused portions of the VTS interface to the respective test components (e.g., 230a, 230b, etc.). For example, a number of bits are siphoned off of the VTS input to component 210 to generate VTS signal 211, where the siphoned portion (e.g., thereafter unused) is fed to multiplexers 220 and 225 via respective input signals 212 and 213. The unused bits (e.g., those originally occupied by bits comprising signals 212 and 213) may then be replaced with FData' bits (e.g., accessed from the main FData' input to component 210) by combining the FData' bits output from multiplexers 220 and 225 with the remaining VTS bits conveyed by signal 211. Test components (e.g., 230a and/or 230b) may then receive the combined VTS/FData' signals (e.g., timing information and timing correction information) to generate test signals for testing coupled DUTs (e.g., 250). Thus, by sending portions of the FData' needed for timing correction over existing VTS paths, embodiments save the cost associated with the design, verification and manufacturing of new and/or additional hardware.

Although FIG. 2 shows only two test components (e.g., 230a and 230b), it should be appreciated that more than two test components may process data from the same data stream and generate test signals for testing a DUT (e.g., 250) at even higher data rates in other embodiments. Additionally, although only one pin electronics component (e.g., 240) is depicted in FIG. 2, it should be appreciated that more than one pin electronics component may be used in other embodiments. Further, although only one DUT (e.g., 250) is depicted in FIG. 2, It should also be appreciated that multiple DUTs may be tested simultaneously in other embodiments.

Although programmable logic component 210 is depicted with specific signal paths and components (e.g., multiplexers 220 and 225), it should be appreciated that component 210 may be alternatively configured (e.g., to accommodate more test components, to accommodate alternatively-configured test components, to direct FData and/or FData' over different signal paths, using lookup tables instead of multiplexers, etc.). Additionally, although FIG. 2 shows only a 32-bit FData signal path feeding component 210, it should be appreciated that a larger or smaller FData signal path may be used in other embodiments. Further, although FIG. 2 depicts only a 3-bit FData' signal path leading to multiplexers 220 and 222 for timing correction purposes, it should be appreciated that a larger or smaller number of FData' bits may be used in other embodiments. Additionally, although FIG. 2 depicts an even allocation of FData between test components, it should be appreciated that an uneven allocation may be used in other embodiments.

Figure 3:
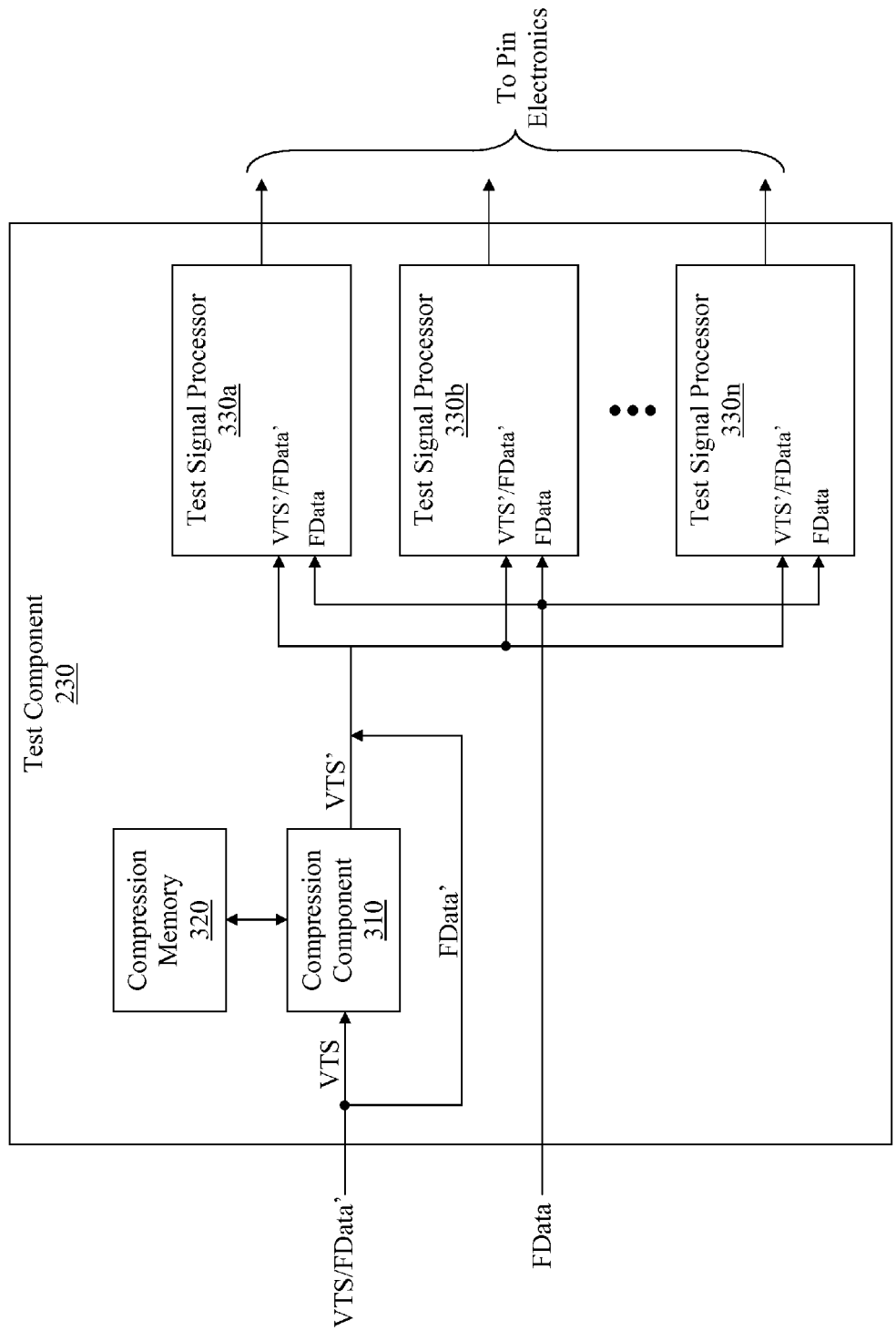
FIG. 3 shows an exemplary test component in accordance with one embodiment of the present invention.

FIG. 3 shows exemplary test component 230 (e.g., used to implement components 230a and/or 230b of FIG. 2) in accordance with one embodiment of the present invention. It should be appreciated that test component 230 may be implemented using an application-specific integrated circuit (ASIC), or the like. Alternatively, test components 230 may be implemented in accordance with the '953 patent to Helland. As shown in FIG. 3, timing information (e.g., generated by a user input to programmable logic component 210, generated automatically by a software program, etc.) and timing correction information (labeled as VTS/FData') is fed to test component 230. The timing information (VTS) may then be fed to compression component 310 for compressing the timing information and generating compressed timing information (VTS'). The timing information may be compressed in accordance with compression information (e.g., a lookup table which may be indexed using uncompressed timing information to retrieve compressed timing information) stored in compression memory 320. The compressed timing information may then be joined with the timing correction information (FData') and fed to test signal processors (e.g., 330a-330n, where n may represent any number greater than two) for providing timing information and timing correction information for generated test signals.

Test signal processors 330a through 330n may generate test signals based upon functional data (FData) received by test component 230 and fed to each test signal processor. As such, the test signal processors may receive state information (e.g., a bit state as shown and described above with respect to FIG. 1) from the FData signal, which may then be used in conjunction with corrected timing information received from the VTS'/FData' signal to generate test signals for testing a DUT (e.g., 250 of FIG. 2).

As shown in FIG. 3, the signals output from each test signal processor may be fed to a respective pin of a DUT (e.g., 250 of FIG. 2) using a pin electronics component (e.g., 240 of FIG. 2), where a similar test signal processor of another test component may also couple to the respective pins of the DUT to effectively send a complied test signal representing the FData input to the system (e.g., system 200 of FIG. 2). Alternatively, signals from one or more test signal processors (e.g., of the same test component) may be fed to a DUT pin, where test signals from other test components may additionally be fed to the DUT pin.

Figure 4:
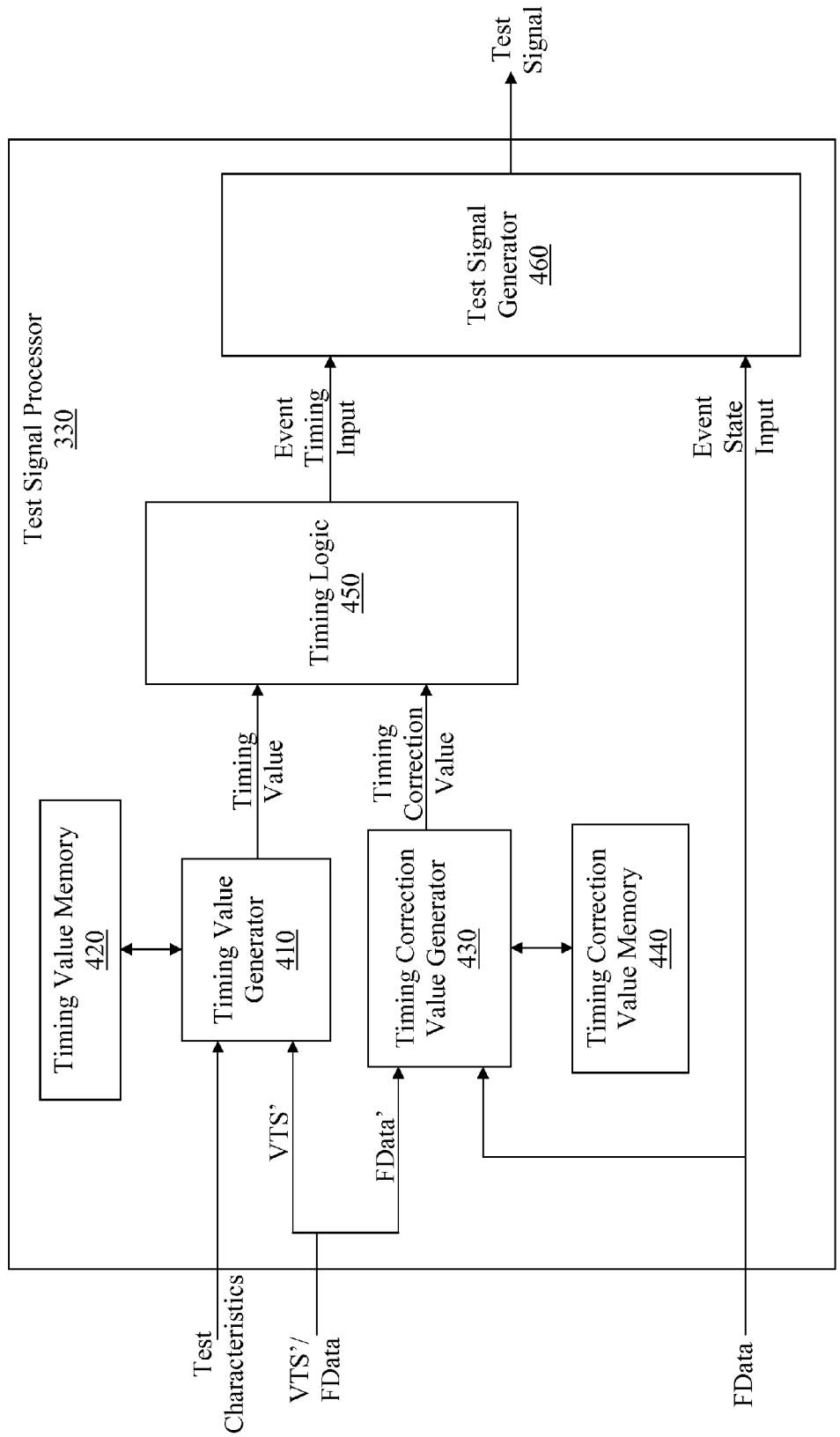
FIG. 4 shows an exemplary test signal processor in accordance with one embodiment of the present invention.

FIG. 4 shows exemplary test signal processor 330 (e.g., used to implement processors 330a-330n of FIG. 3) in accordance with one embodiment of the present invention. As shown in FIG. 4, timing value generator generates timing values (e.g., the original timing value as shown in FIG. 1) for events (e.g., 120 of FIG. 1) by accessing timing value memory 420 using VTS' information fed to generator 410. The VTS' information may indicate a portion of timing information (e.g., a set of timing information for a group of data sharing a common timing offset, test period, etc.) stored in memory 420, where generator 410 may then select a timing value from the portion of timing information for a currently-processed event. Once the timing value is generated by generator 410, it may be output to timing logic 450 for timing correction (if needed) as discussed below.

Timing value memory 420 may be periodically filled and/or refreshed based upon test characteristics input to test signal processor 330. In one embodiment, the filling and/or refreshing may be performed by timing value generator 410. The values input to memory 420 may be determined in one embodiment by the equation:

$$T_x = O + ((P/B) * x),$$

where Tx represents a timing value for a given bit of a bit stream, O represents a timing offset (e.g., applied to one or more bits processed by a test component), P represents a test period (e.g., a time required for a test component to process a given string of bits), B represents a number of bits processed by an individual test component (e.g., 16 as shown in FIG. 2), and x is varied from zero to B−1 to generate timing values comprising a timing value set to be stored in memory 420 (e.g., as a data table therein). Other timing value sets may be generated and stored in memory 420, where each set may have at least one common test characteristic (e.g., offset, period, etc.).

FIG. 5 shows exemplary timing value data table 500 stored in memory (e.g., timing value memory 420) in accordance with one embodiment of the present invention. As shown in FIG. 5, data table 500 comprises multiple timing sets which may be selected (e.g., using VTS' input to timing value generator 410), where each timing set has values which may correspond to a bit in a functional data stream (e.g., the 32-bit FData stream as shown in FIG. 2). Each timing set shares a common timing offset (e.g., each timing value of timing set 1 has an offset of 1.1 ns, etc.). However, in other embodiments, each set may share another test characteristic (e.g., period, etc.). Alternatively, timing sets of data table 500 may comprise different shared test characteristics. Additionally, although FIG. 5 shows timing sets with timing values for only 32 bits, it should be appreciated that data table 500 may comprise timing values for a larger or smaller number of bits in other embodiments.

Turning back to FIG. 4 and using the timing values of FIG. 5 as examples, timing value generator may begin processing a bit of a functional data stream (e.g., FData of FIG. 2) representing an event (e.g., 120 of FIG. 1). A received VTS' input may indicate that a specific timing set is to be used to determine a timing value for that event. Thereafter, generator may use the indicated timing set and the bit number of the event to determine a timing value. For example, if the current event processed by a test component comprises bit F2 of the data stream and the VTS' input indicates that timing set 2 is to be used, then generator 410 may determine that the timing value for that event is 2.125 ns. The determined timing value may then be sent to timing logic 450 for correction (if needed).

As shown in FIG. 4, timing correction value generator 430 receives data (e.g., FData' and/or portions of FData) for generating a timing correction value. FData' may comprise functional data processed by other test components than that processing the event, while the portions of FData may comprise functional data processed by the same test component processing the event. As such, portions of the FData' signal may be used if data preceding the event and contributing to the timing error are processed as events by another test component.

Figure 6:
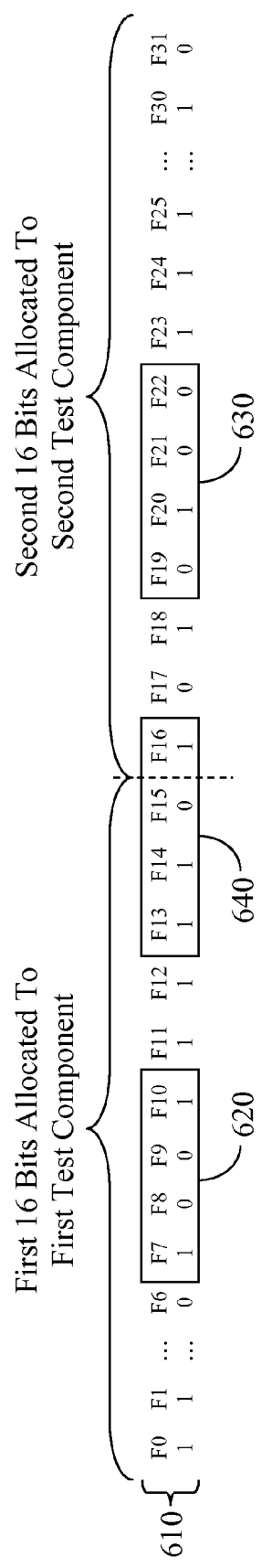
FIG. 6 shows an exemplary data stream for allocation among multiple test components in accordance with one embodiment of the present invention.

FIG. 6 shows exemplary data stream 610 for allocation among multiple test components in accordance with one embodiment of the present invention. As shown in FIG. 5, data stream 610 may comprise functional data representing event states for a plurality of bits (e.g., F0-F31). Bits F0-F15 may be allocated for event processing to a first test component (e.g., 230a of FIG. 2), while bits F16-F31 may be allocated for event processing to a second test component (e.g., 230b of FIG. 2).

As shown in FIG. 6, several 4-bit data blocks are denoted. Block 620 represents an event processed at bit F10, where generation of a timing correction value for the event may consider a pulse duration (or a portion thereof) within bits F7 through F10 (e.g., all processed by the first test component).

Similarly, block 630 represents an event processed at bit F22, where generation of a timing correction value may consider a pulse duration (or a portion thereof) within bits F19 through F22 (e.g., all processed by the second test component). However, block 640 represents an event processed at bit F16, where generation of a timing correction value may consider a pulse duration (or a portion thereof) within bits F13 through F16. As such, block 640 presents a situation where correction of a timing error must use FData' from another test component (e.g., the first test component in FIG. 6) than that processing the event (e.g., the second test component in FIG. 6), while blocks 620 and 630 required only the use of FData from the same test component processing the event.

Turning back to FIG. 4, timing correction value generator 430 may generate a timing correction value by accessing timing correction value memory 440. FData and/or FData' input to generator 430 may be used to identify a timing correction value stored within memory 440, where generator 430 may then access the identified timing correction value for generation thereof. Once the timing correction value is generated by generator 430, it may be output to timing logic 450 for timing correction (if needed) as discussed below.

FIG. 7 shows exemplary timing correction value data table 700 stored in memory (e.g., timing correction value memory 440) in accordance with one embodiment of the present invention. As shown in FIG. 7, the first four columns of data table 700 comprise bit states for an event bit ($F_n$) and the three bits leading up to the event bit (e.g., $F_{n-3}$ through $F_{n-1}$). The bit states may represent a portion of a pulse width preceding an event that contributes to timing error for the event (e.g., 120 of FIG. 1). The fifth column specifies exemplary timing correction values for a given ordering of bit states shown in the rows of data table 700. As such, a memory (e.g., 440) comprising data table 700 may be accessed with four bit states to then identify an appropriate timing correction value.

Although FIGS. 6 and 7 use 4-bit data blocks, it should be appreciated that data blocks of longer or shorter lengths may be used. Additionally, although the data blocks shown in FIG. 6 and indicated in FIG. 7 are continuous, it should be appreciated that non-continuous data may be used to generate timing correction values in other embodiments. Additionally, although specific data blocks are identified in FIG. 6, it should be appreciated that other data blocks may be identified in other embodiments which require a larger or smaller number of FData and/or FData' bits to be accessed.

Turning back to FIGS. 4 and 6, when timing correction value generator 430 is ready to process bit F10 of block 620 of FIG. 6, the four bit values in block 620 (e.g., 1, 0, 0, 1) may be used to access data table 700 and determine a timing correction value of −10 ps. Alternatively, when timing correction value generator 430 is ready to process bit F22 of block 630 of FIG. 6, the four bit values in block 630 (e.g., 0, 1, 0, 0) may be used to access data table 700 and determine a timing correction value of 0 ps (e.g., no timing correction needed). Alternatively, when timing correction value generator 430 is ready to process bit F16 of block 640 of FIG. 6, the four bit values in block 640 (e.g., 1, 1, 0, 1) may be used to access data table 700 and determine a timing correction value of 15 ps.

As shown in FIG. 4, timing logic 450 may access both a timing value (e.g., output by generator 410) and a timing correction value (e.g., output by generator 430) to generate an updated timing value for a currently-processed event. In one embodiment, the logic may add the timing correction value to the timing value to generate the updated timing value. In other embodiments, other functions may be used to determine the updated timing value for a currently-processed event. If the timing correction value indicates that no correction is necessary (e.g., outputting a timing correction value of zero), then the timing value output by generator 410 may be output by logic 450 instead of an updated timing value.

Test signal generator 460 may access an event timing output from timing logic 450 (e.g., comprising the updated timing value where timing correction is needed, comprising the original timing value where no timing correction is needed, etc.) and an event state input from an FData input to test signal processor 330. From this information, generator 460 may output a test signal (e.g., 110) comprising the event state and event timing, where the test signal may be fed to a DUT (e.g., 250 of FIG. 2) for testing (e.g., via a pin electronics component).

Figure 8:
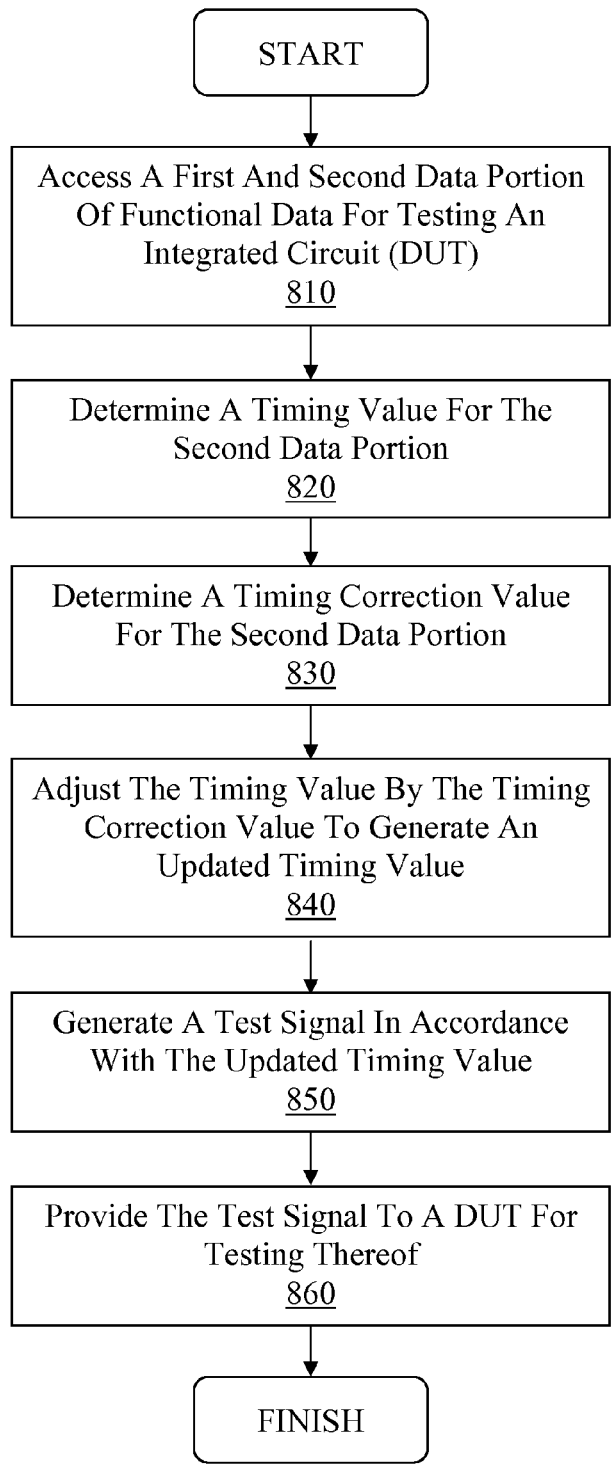
FIG. 8 shows an exemplary process for correcting timing errors in automated test equipment in accordance with one embodiment of the present invention.

FIG. 8 shows exemplary process 800 for correcting timing errors in automated test equipment in accordance with one embodiment of the present invention. As shown in FIG. 8, step 810 involves accessing a first and second data portion of functional data for testing an integrated circuit (DUT). The first portion may comprise bits leading up to an event bit (e.g., bits F13-F15 of block 640 of FIG. 6), while the second portion may comprise an event bit (e.g., F16 of FIG. 6). Additionally, the first data portion may be processed by a first test component (e.g., 230*a* of FIG. 2) and the second data portion may be processed by a second test component (e.g., 230*b* of FIG. 2), thereby dividing processing among multiple test components to increase the data rate of the system (e.g. to approach the sum of the data rates of the individual test components).

Step 820 involves determining a timing value for the second data portion. The timing value may be determined by a timing value generator (e.g., 410) accessing a timing value memory (e.g., 420). The timing value may depend upon one or more test characteristics (e.g., timing offset, period, etc.), which may be input to an ATE system (e.g., 200 of FIG. 2) either manually (e.g., by a user) or automatically (e.g., by a software program, etc.).

Step 830 involves determining a timing correction value for the second data portion. The timing correction value may be determined by a timing correction value generator (e.g., 430) accessing a timing correction value memory (e.g., 440). The timing correction value may depend upon a duration of a portion of a pulse width in data preceding the event data (e.g., represented by event 120 of FIG. 1) for which the timing correction value is being determined. For example, the three bits preceding the event bit in a functional data stream may be used to determine a timing correction value (e.g., by accessing a memory similar to memory 440 as shown in FIG. 7). The data used for determining the timing correction value may be accessed from either the component processing the event or from another component (e.g., by feeding FData' portions from the other components as described in the preceding Figures), thereby enabling timing error reduction for ATE systems (e.g., 200) using multiple test components regardless of which test component's data the error may be attributed.

Step 840 involves adjusting the timing value by the timing correction value to generate an updated timing value. The updated timing value may be generated by timing logic (e.g., 450), where the logic is operable to apply the timing correction value to the timing value to generate the updated timing value. In one embodiment, the timing correction value may be added to the timing value to generate the updated timing value. In other embodiments, other functions may be used to determine the updated timing value for a currently-processed event. If the timing correction value indicates that no correction is necessary (e.g., outputting a timing correction value of zero), then the timing value may be used instead of an updated timing value.

Step 850 involves generating a test signal in accordance with the updated timing value. The test signal may be generated by a test signal generator (e.g., 460 of a test component (e.g., 230*a*, 230*b*, etc.), where the test signal is representative of a portion of the FData fed to the test component. Thereafter, the generated test signal may be fed to a DUT (e.g., 250 of FIG. 2) in step 860 for testing thereof.

Figure 9:
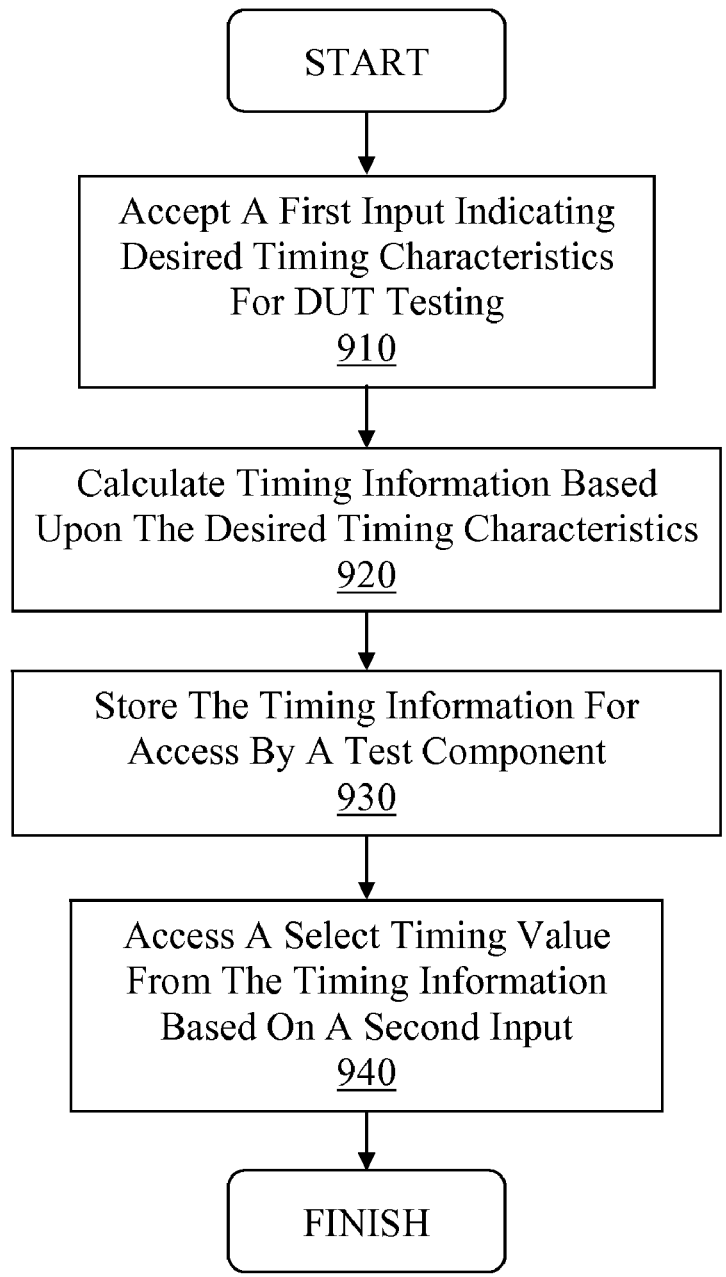
FIG. 9 shows an exemplary process for determining a timing value in accordance with one embodiment of the present invention.

FIG. 9 shows exemplary process 900 for determining a timing value in accordance with one embodiment of the present invention. As shown in FIG. 9, step 910 involves accepting a first input indicating desired timing characteristics for DUT testing. The desired timing characteristics may comprise test characteristics (e.g., timing offset, period, etc.). Additionally, the timing characteristics may be input to a timing value generator (e.g., 410), where the input may be either manual (e.g., by a user) or automatic (e.g., by a software program, etc.).

Step 920 involves calculating timing information based upon the desired timing characteristics. The timing information may comprise timing values, where the timing values may be calculated as discussed above with respect to FIG. 4.

Step 930 involves storing the timing information for access by a test component. The timing information (e.g., data table 500) may be stored in a timing value memory (e.g., 420 of FIG. 4), where the timing information may indicate sets of timing values for various bit locations in a functional data string. The timing value sets may share at least one common test characteristic (e.g., timing offset, period, etc.).

Step 940 involves accessing a select timing value from the timing information based on a second input. The second input may comprise a timing set selection, where the timing set selection may be used to access a timing value memory to identify and access an appropriate timing value for a currently-processed event. The second input may be either manual (e.g., by a user) or automatic (e.g., by a software program, etc.).

Figure 10:
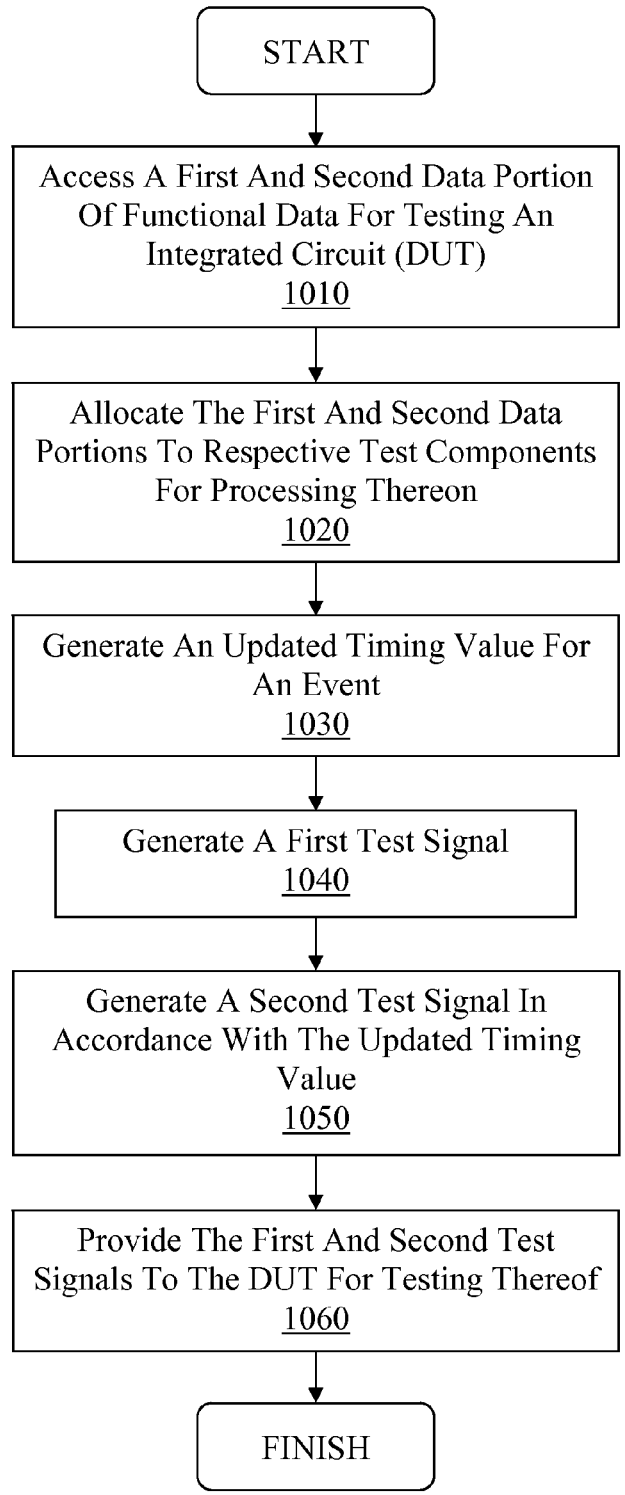
FIG. 10 shows an exemplary process for increasing data rates of automated test equipment with data-dependent correction capabilities in accordance with one embodiment of the present invention.

FIG. 10 shows exemplary process 1000 for increasing data rates of automated test equipment with data-dependent correction capabilities in accordance with one embodiment of the present invention. As shown in FIG. 10, step 1010 involves accessing a first and second data portion of functional data for testing an integrated circuit (DUT). Step 1010 may be performed analogously to step 810 of FIG. 8.

Step 1020 involves allocating the first and second data portions to respective test components for processing thereon. For example, the first data portion may be processed on a first test component (e.g., 230*a* of FIG. 2) of a system (e.g., 200 of FIG. 2), while the second data portion may be processed on a second test component (e.g., 230*b* of FIG. 2) of the same system. As such, higher data rates (e.g., approaching the sum of the individual components' data rates) are possible as processing is divided among multiple test components.

Step 1030 involves generating an updated timing value for an event. The updated timing value may be generated as discussed above with respect to FIG. 840 of FIG. 8.

Step 1040 involves generating a first test signal. The first test signal may be generated by a first test component (e.g., 230*a* of FIG. 2) and representative of a first portion of a functional data stream (e.g., FData input to system 200 in FIG. 2).

Step 1050 involves generating a second test signal in accordance with the updated timing value. Step 1050 may be performed analogously to step 850 of FIG. 8.

Step 1060 involves providing the first and second test signals to the DUT for testing thereof. As such, the DUT may be tested at higher data rates using multiple test components, where embodiments enable timing error reduction regardless of which component is processing the functional data contributing to the error.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A system comprising:
   a first test component operable to generate a first test signal, based on first data, for testing an integrated circuit; and
   a second test component operable to generate a second test signal, based on second data, for testing said integrated circuit, wherein said second test component is operable to access a portion of said first data, and wherein said second test component is operable to correct at least one timing error in said second test signal using said portion of said first data.

2. The system of claim 1, wherein said first test component is operable to correct at least one timing error in said first test signal based on said first data, and wherein said second test component is operable to correct at least one timing error in said second test signal based on said second data.

3. The system of claim 1 further comprising:
   an interface coupled to said second test component and operable to enable said second test component to access said portion of said first data.

4. The system of claim 1, wherein said first data and said second data each comprise at least one respective test pattern for testing said integrated circuit.

5. The system of claim 1, wherein said first data and said second data are adjoining portions of functional data for testing said integrated circuit.

6. The system of claim 1, wherein said first and second test components are coupled to a shared pin of said integrated circuit, wherein said first and second test signals each provide a respective portion of a test waveform to said integrated circuit.

7. The system of claim 1, wherein said second test component further comprises:
   a timing value generator operable to determine a timing value for said second data, wherein said timing value is operable to indicate when an event associated with said second data shall occur;
   a timing correction value generator operable to determine a timing correction value for said second data based on a pulse width associated with said first data; and
   a test signal generator operable to generate said second test signal with an updated timing value based on said timing value and said timing correction value.

8. The system of claim 1, wherein said portion of said first data comprises at least one bit of said first data used to correct timing for a particular bit of said second data.

9. The system of claim 8, wherein said at least one bit is associated with a portion of a pulse width preceding an event associated with said particular bit, and wherein said second test component is operable to correct said at least one timing error in said second test signal by applying a durational shift related to a duration of said portion of said pulse width.

10. A method of correcting at least one timing error, said method comprising:
    generating a first test signal for testing an integrated circuit, wherein said first test signal is generated using a first test component based on first data;
    generating a second test signal for testing said integrated circuit, wherein said second test signal is generated using a second test component based on second data; and
    correcting at least one timing error, using said second test component, in said second test signal based on a portion of said first data.

11. The method of claim 10 further comprising:
    correcting at least one timing error, using said first test component, in said first test signal based on said first data; and
    correcting at least one timing error, using said second test component, in said second test signal based on said second data.

12. The method of claim 10, wherein said first data and said second data each comprise at least one respective test pattern for testing said integrated circuit.

13. The method of claim 10, wherein said first data and said second data are adjoining portions of functional data for testing said integrated circuit.

14. The method of claim 10, wherein said first and second test components are coupled to a shared pin of said integrated circuit, wherein said first and second test signals each provide a respective portion of a test waveform to said integrated circuit.

15. The method of claim 10, wherein said correcting said at least one timing error further comprises:
    determining a timing value for said second data, wherein said timing value is operable to indicate when an event associated with said second data shall occur;
    determining a timing correction value for said second data based on a pulse width associated with said first data; and
    generating said second test signal with an updated timing value based on said timing value and said timing correction value.

16. The method of claim 10, wherein said portion of said first data comprises at least one bit of said first data used to correct timing for a particular bit of said second data.

17. The method of claim 16, wherein said at least one bit is associated with a portion of a pulse width preceding an event associated with said particular bit, and wherein said correcting said at least one timing error further comprises applying a durational shift related to a duration of said portion of said pulse width.

18. The method of claim 10 further comprising:
    providing said first and second test signals to said integrated circuit for testing thereof.

19. A method of generating at least one timing value for automated test equipment, said method comprising:
    accessing functional data for testing an integrated circuit, wherein said functional data comprises a first data portion and a second data portion;
    allocating said first data portion to a first test component for generating a first test signal;
    allocating said second data portion to a second test component for generating a second test signal, wherein said second data portion comprises a timing value operable to indicate when an event associated with said second data portion shall occur; and
    generating an updated timing value for said event by applying a timing correction value to said timing value.

20. The method of claim 19 further comprising:

generating said first test signal using said first test component;

generating said second test signal, using said second test component, in accordance with said updated timing value; and providing said first and second test signals to said integrated circuit for testing thereof.

21. The method of claim 19, wherein said functional data comprises at least one test pattern for testing said integrated circuit.

22. The method of claim 19 further comprising:

accessing a first user input associated with at least one timing characteristic for a test of said integrated circuit;

calculating timing information based upon said at least one timing characteristic;

storing said timing information for access by said second test component; and responsive to a second user input associated with a portion of said timing information, accessing a particular timing value from said timing information based on said second user input.

23. The method of claim 22, wherein said at least one timing characteristic is selected from a group consisting of a test period and a timing offset.

24. The method of claim 19, wherein said timing correction value comprises a durational shift.

25. The method of claim 19, wherein said first data portion comprises a portion of a pulse width, and wherein said timing correction value is based on said portion of said pulse width.

26. The method of claim 25 further comprising:

determining a pulse duration of said pulse width; and accessing a timing correction value corresponding to said pulse duration.

27. The method of claim 25, wherein said pulse width is associated with at least one bit of said first data portion used to correct timing for a particular bit of said second data portion.

* * * * *